(12) United States Patent
Plass et al.

(10) Patent No.: US 7,521,723 B2
(45) Date of Patent: Apr. 21, 2009

(54) SURFACE EMITTING SEMICONDUCTOR LASER CHIP AND METHOD FOR PRODUCING THE CHIP

(75) Inventors: Werner Plass, Regensburg (DE); Christian Jung, Sinzing (DE); Tony Albrecht, Bad Abbach (DE); Udo Streller, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/631,384

(22) Filed: Jul. 31, 2003

(65) Prior Publication Data

US 2005/0098788 A1  May 12, 2005

(30) Foreign Application Priority Data

Jul. 31, 2002  (DE) ................. 102 34 976

(51) Int. Cl.
  *H01L 21/00* (2006.01)
(52) U.S. Cl. .................. 257/95; 257/98; 257/E21.121; 257/E21.131; 257/E21.127; 438/29
(58) Field of Classification Search .................. 257/95, 257/200, 98; 438/29
See application file for complete search history.

(56) References Cited

U.S. PATENT DOCUMENTS

| | | | | |
|---|---|---|---|---|
| 3,901,738 A | * | 8/1975 | Hunsperger et al. | 372/46.015 |
| 4,990,465 A | * | 2/1991 | Liau et al. | 438/29 |
| 6,154,479 A | | 11/2000 | Yoshikawa et al. | |
| 6,483,860 B1 | * | 11/2002 | Ueki et al. | 372/45 |
| 6,584,136 B2 | * | 6/2003 | Ju et al. | 372/102 |
| 2002/0109148 A1 | * | 8/2002 | Shveykin | 257/95 |
| 2003/0007531 A1 | * | 1/2003 | Aggerstam | 372/46 |
| 2003/0152125 A1 | * | 8/2003 | Kinoshita | 372/96 |
| 2004/0048429 A1 | * | 3/2004 | Baur et al. | 438/200 |
| 2004/0217381 A1 | * | 11/2004 | Wang et al. | 257/202 |
| 2005/0003565 A1 | * | 1/2005 | Eisert et al. | 438/22 |
| 2007/0105349 A1 | * | 5/2007 | Hallin et al. | 438/478 |

FOREIGN PATENT DOCUMENTS

| | | | |
|---|---|---|---|
| DE | 100 38 235 A1 | | 2/2002 |
| JP | 8-116125 | * | 5/1996 |
| JP | 2001-244564 | * | 9/2001 |
| WO | WO 02/37578 | * | 5/2002 |

OTHER PUBLICATIONS

G. Winsetel: "Optoelektronik I", Springer Verlag, Germany, 1980, pp. 300-309.
Neil W. Ashcroft et al., Cornell University, "Solid State Physics", Saunders College Publishing, Harcourt Brace College Publishers (1976), Chapters 4-5, pp. 63-94.

* cited by examiner

*Primary Examiner*—A. Sefer
(74) *Attorney, Agent, or Firm*—Cohen Pontani Lieberman & Pavane LLP

(57) ABSTRACT

A surface emitting semiconductor laser chip contains a semiconductor body, which has, at least partly, a crystal structure with principal crystal directions, a radiation exit face, and side faces laterally delimiting the semiconductor body. At least one of the side faces is disposed obliquely with respect to the principal crystal directions.

11 Claims, 2 Drawing Sheets

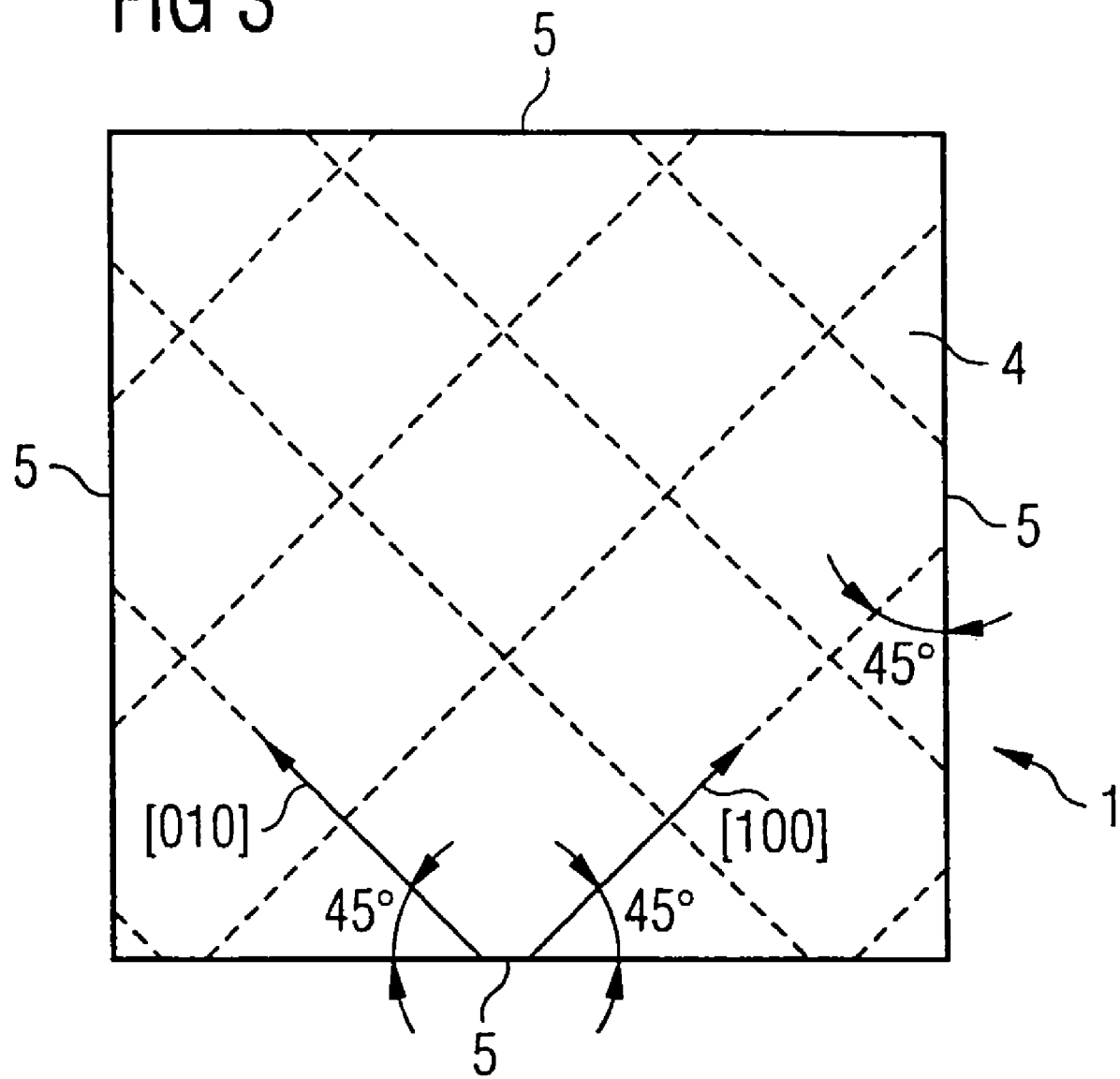

SURFACE EMITTING SEMICONDUCTOR LASER CHIP AND METHOD FOR PRODUCING THE CHIP

BACKGROUND OF THE INVENTION

Field of the Invention

The invention relates to a surface emitting semiconductor laser chip having a semiconductor body. The semiconductor body has, at least partly, a crystal structure with principal crystal directions, a radiation exit face, and side faces laterally delimiting the semiconductor body. The semiconductor body is then divided into a plurality of semiconductor laser chips along separating lines.

Surface emitting semiconductor lasers are disclosed in Published, Non-Prosecuted German Patent Application DE 100 38 235 A1, for example. What is characteristic of such lasers is an emission direction disposed perpendicular to the chip surface. The semiconductor lasers are often also referred to as vertical cavity surface emitting laser (VCSEL). They differ in this in particular from so-called edge emitting lasers, in which the emission is effected through a side face of the laser chip.

In this case the designations "surface" and "side face" are associated with the fabrication of such chips in the wafer composite, the "surface" corresponding to the wafer surface. The side faces, by contrast, are only produced when the wafer is divided into individual semiconductor chips.

In a customary method for producing edge emitting laser chips, a wafer is usually broken in order to be divided into individual semiconductor chips, the breaking line running along a principal crystal direction of the wafer. This gives rise to side faces of the semiconductor bodies in the form of smooth cleavage faces that are simultaneously mirror facets of the respective laser resonators.

In the case of surface emitting lasers, the formation of such cleavage faces as side faces is not necessary on account of the different, perpendicular orientation of the resonator or emission direction. In order to produce such laser chips, therefore, the corresponding wafers can also be divided by sawing or etching instead of by breaking.

It has been ascertained in the case of light-emitting diode chips that a frequent ageing mechanism is based on dislocation lines arising in the semiconductor crystal. The dislocation lines can propagate during operation and form nonradiative recombination centers. Such crystal defects lower the efficiency of the device and may finally lead to failure. In the luminescent image of a semiconductor crystal, such crystal defects are seen as dark lines, and so they are also referred to as dark line defects (DLDs).

SUMMARY OF THE INVENTION

It is accordingly an object of the invention to provide a surface emitting semiconductor laser chip and method for producing the chip that overcome the above-mentioned disadvantages of the prior art devices and methods of this general type, which has an improved ageing behavior or an increased lifetime. In particular, the intention is to reduce the production of nonradiative recombination centers or DLDs. Furthermore, it is an object of the invention to specify a corresponding production method.

The invention provides for the formation of a surface emitting semiconductor laser chip having a semiconductor body, which has, at least partly, a crystal structure with assigned principal crystal directions, a radiation exit face and side faces laterally delimiting the semiconductor body. At least one side face is disposed obliquely, i.e. neither parallel nor perpendicular, with respect to the principal crystal directions. The radiation emission is effected during operation essentially perpendicular to the radiation exit face extending in the lateral direction.

Disposing the side faces obliquely with respect to the principal crystal directions has the advantage that fewer seeds for dislocation lines arise in the crystal structure and the number of dislocation lines thus decreases. This slows down the ageing of the semiconductor chip.

The semiconductor body preferably has a rectangular or square cross section parallel to the radiation exit face. This form can easily be fabricated from a wafer by sawing a wafer along sawing lines that cross one another orthogonally, it advantageously being possible for all the side faces to be disposed obliquely with respect to the principal crystal directions. In the invention, further preference is attached to at least one of the side faces being formed perpendicular to the radiation exit face.

The invention is suitable in particular for semiconductor materials having a cubic crystal structure, in which case, by way of example, without restricting the generality, the crystal directions [100] and [010] lie parallel to the radiation exit face and to the wafer surface, respectively. In this case, it is advantageous to dispose the side faces such that they form an angle of between 40° and 50°, preferably 45°, with the principal crystal directions [100] and [010].

In an advantageous refinement of the invention, the semiconductor body has a substrate in the form of a semiconductor crystal, which defines the crystal directions, for example [100] and [010]. In this case, the laser structure is applied as a semiconductor layer sequence on the substrate. Such a layer sequence may be grown by an epitaxy method, for example.

The semiconductor body is preferably based on the GaAs/AlGaAs material system. In addition to the GaAs and AlGaAs, the semiconductor body may, of course, also contain other compounds such as, for example, AlGaInAs or InGaAs. Other III-V semiconductors or nitride compound semiconductors, for example the compounds GaP, InGaP, InAsP, GaAlP, InGaAlP, GaAsP, InGaAsP and InGaNAs are also suitable in the invention.

A production method according to the invention provides first for a wafer with a plurality of surface emitting semiconductor laser structures to be produced by a conventional fabrication method, the wafer having a crystal structure with principal crystal directions. The wafer is subsequently divided into a plurality of semiconductor laser chips along predetermined separating lines. The separating lines are disposed such that they run obliquely, that is to say neither parallel nor perpendicular, with respect to the principal crystal directions. The wafer is preferably sawn or divided by an etching method.

Disposing the separating lines obliquely with respect to the principal crystal directions advantageously reduces the formation of seeds for dislocation lines and, consequently, the production of ageing-accelerating dislocation lines or DLDs.

Other features which are considered as characteristic for the invention are set forth in the appended claims.

Although the invention is illustrated and described herein as embodied in a surface emitting semiconductor laser chip and method for producing the chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a diagrammatic plan view of a second exemplary embodiment of a surface emitting semiconductor laser chip according to the invention.

DESCRIPTION OF THE PREFERRED EMBODIMENTS

Figure 1:
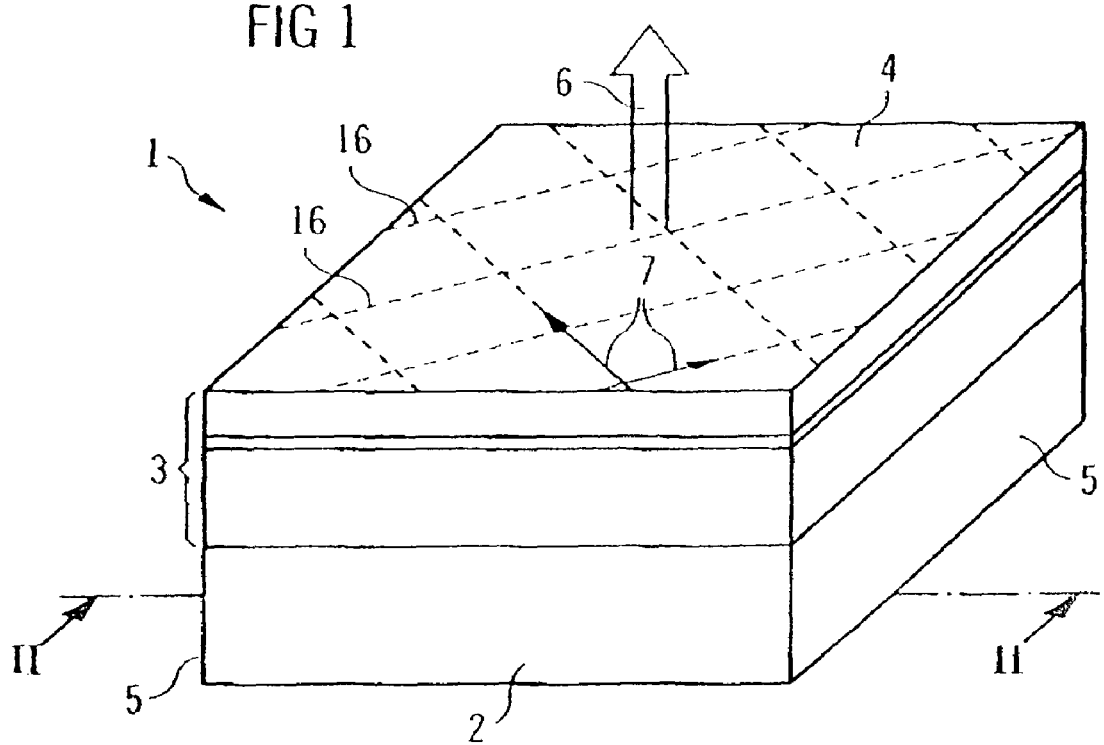
FIG. 1 is a diagrammatic perspective view of a first exemplary embodiment of a surface emitting semiconductor laser chip according to the invention.

In all the figures of the drawing, sub-features and integral parts that correspond to one another bear the same reference symbol in each case. Referring now to the figures of the drawing in detail and first, particularly, to FIG. 1 thereof, there is shown diagrammatically a semiconductor laser chip of a VCSEL. The chip contains a substrate 2, to which a stack of semiconductors layers 3 is applied. The semiconductor layers 3 form a radiation-generating laser structure of the component in this case. The structure is explained in more detail below in connection with FIG. 2.

The semiconductor body 1 containing the semiconductor layers 3 has a radiation exit face 4 and is laterally delimited by a plurality of side faces 5. During operation, laser radiation 6 is emitted essentially in a direction perpendicular to the radiation exit face 4.

The substrate 2 and the semiconductor layers 3 applied thereto have, at least partly, a crystal structure. The crystal lattice in a lateral direction is illustrated by the broken lines 16 and the associated principal crystal directions 7 are illustrated by arrows.

In the case of layers grown epitaxially, the structure is generally prescribed by the substrate. The principal crystal directions 7 of the semiconductor layers are thus also defined in a lateral direction. What is essential to the invention is that the side faces 5 are disposed such that they run obliquely with respect to the principal crystal directions 7, that is to say neither parallel nor perpendicular to the directions.

It has been ascertained in the context of the fabrication of LEDs that such a configuration of the side faces 5 with respect to the principal crystal directions 7, in contrast to a parallel or perpendicular configuration, advantageously reduces the formation of seeds for dislocation lines and an accompanying accelerated ageing of the component. Although the radiation-emitting region is significantly further away from the sawing track in the case of surface emitting semiconductor laser chips than in the case of LEDs, it has been found in the case of the invention that in this, too, the ageing of the component can advantageously be reduced by the configuration of the side faces with respect to the principal crystal directions.

Figure 2:
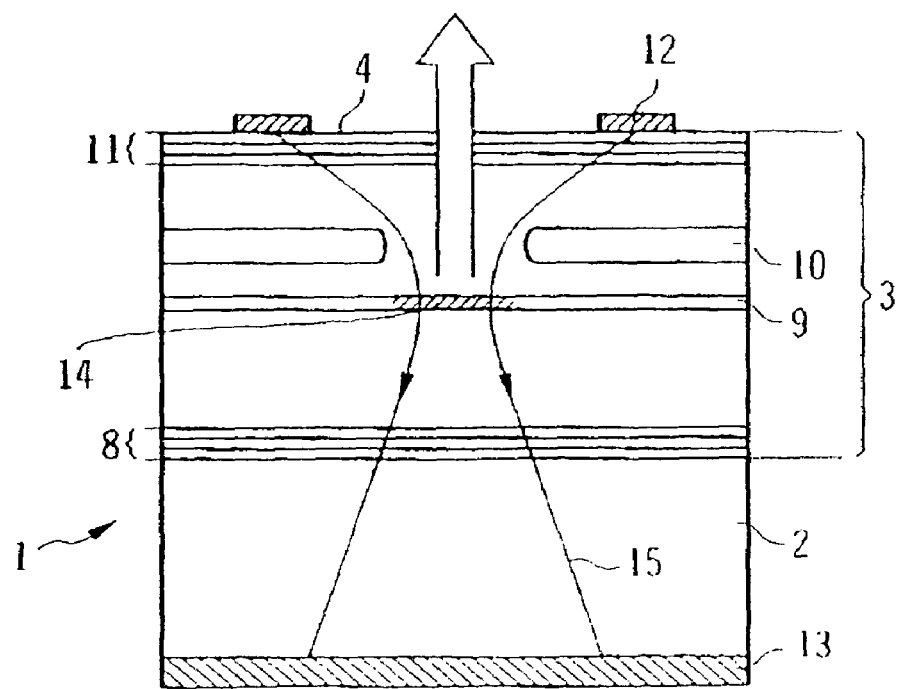
FIG. 2 is a diagrammatic sectional view, taken along the line II-II shown in FIG. 1, of the first exemplary embodiment.

FIG. 2 represents a sectional view taken along the line II-II through the exemplary embodiment shown in FIG. 1. The semiconductor layers 3 are disposed on the substrate 2, for example a GaAs substrate 2. The layer stack 3 contains mirror layers 8, 11, which form the laser resonator and may be embodied as Bragg mirrors, for example. Such Bragg mirrors may be realized for example in each case as a layer sequence with alternate layers made of $Al_{0.2}Ga_{0.8}As$ and $Al_{0.9}Ga_{0.1}As$.

An active layer 9 is disposed between the mirror layers 8, 11. The active layer 9 is preferably configured as a quantum well structure, for example in the form of a single quantum well (SQW) structure or a multiple quantum well (MQW) structure. An example of a suitable MQW structure is a structure having three GaAs quantum wells with an emission wavelength of about 850 nm.

A layer 10 is formed as a so-called current constriction layer which, during operation, guides the pumping current, represented by way of example using current paths 15, toward the center of the active layer 9 and thus increases the pumping density of the laser. The current constriction layer may be formed as an AlAs layer; it is partly laterally oxidized.

In this case, an active radiation-emitting zone 14 arises in the center of the active layer 9, in which case, when the pumping threshold or the threshold current is exceeded, the laser starts to oscillate and emits laser radiation 6 in a direction perpendicular to the radiation exit face 4. For supplying the pumping current, contact metallizations 12, 13 are provided on the radiation exit face 4 and the opposite surface of the substrate 2. The contact metallization 12 is embodied as a ring contact, for example. The contact metallization 12 is preferably embodied as a p-contact, for example as a TiPtAu contact, and the contact metallization 13 as an n-contact, for example as an AuGe contact.

For the sake of clarity, the contact metallizations 12, 13 are not represented in FIG. 1.

FIG. 3 shows a diagrammatic plan view of a second exemplary embodiment of the invention. The semiconductor body 1 essentially corresponds to the exemplary embodiment represented in FIG. 1. A GaAs-based material is used as the semiconductor material. Without restricting the generality, the principal crystal directions [100] and [010] are disposed parallel to the radiation exit face 4. The semiconductor body 1 has a square cross section parallel to the radiation exit face 4, as shown by the plan view, and is laterally delimited by side faces 5. The side faces 5 in each case form an angle of 45° with the principal crystal directions [100] and [010].

It has been found that the ageing behavior of a corresponding component, such as a VCSEL, for example, can be significantly improved by a configuration of this type.

We claim:

1. A surface emitting semiconductor laser chip, comprising:
   a semiconductor body having a radiation exit face,
   a crystal structure having principal crystal directions extending along a lateral direction of the radiation exit face, and
   side faces laterally delimiting said semiconductor body, at least one of said side faces disposed obliquely with respect to said principal crystal directions and perpendicularly with respect to said radiation exit face.

2. The semiconductor laser chip according to claim 1, wherein said semiconductor body has a cross section selected from the group of square cross sections and rectangular cross sections disposed parallel to said radiation exit face.

3. The semiconductor laser chip according to claim 1, wherein at least one of said principal crystal directions extends parallel to said radiation exit face, and at least one of said side faces forms an angle of between 40° and 50° with said at least one principal crystal direction.

4. The semiconductor laser chip according to claim 1, wherein said angle is 45°.

5. The semiconductor laser chip according to claim 3, wherein said at least one principal crystal direction is a [100] direction.

6. The semiconductor laser chip according to claim 1, wherein the semiconductor body contains a substrate having, at least partly, a crystal structure.

7. The semiconductor laser chip according to claim 6, wherein said semiconductor body contains as III-V compound semiconductor.

8. The semiconductor laser chip according to claim 7, wherein said III-V compound semiconductor is selected from the group consisting of GaAs, AlGaAs, and a nitride compound semiconductor.

9. The semiconductor laser chip according to claim 1, wherein the semiconductor laser chip is a VCSEL.

10. The semiconductor laser chip according to claim 1, wherein the radiation exit face is a polygon having an even number of sides, wherein the side faces are disposed obliquely with respect to the principal crystal direction and perpendicularly with respect to said radiation exit face.

11. The semiconductor laser chip according to claim 10, wherein the polygon is a rectangle.

* * * * *

UNITED STATES PATENT AND TRADEMARK OFFICE
CERTIFICATE OF CORRECTION

| | | |
|---|---|---|
| PATENT NO. | : 7,521,723 B2 | Page 1 of 1 |
| APPLICATION NO. | : 10/631384 | |
| DATED | : April 21, 2009 | |
| INVENTOR(S) | : Werner Plass et al. | |

It is certified that error appears in the above-identified patent and that said Letters Patent is hereby corrected as shown below:

Please correct Claim 4 at column 4, lines 66 to 67 of said Letters Patent as follows:

-- 4. The semiconductor laser chip according to claim 3 [[1]], wherein said angle is 45°. --

Signed and Sealed this

Third Day of August, 2010

David J. Kappos
*Director of the United States Patent and Trademark Office*